US007954083B2

(12) United States Patent
Berenbach et al.

(10) Patent No.: US 7,954,083 B2
(45) Date of Patent: May 31, 2011

(54) SYSTEM AND METHOD FOR SPECIFYING FUNCTIONAL AND NON-FUNCTIONAL REQUIREMENTS FOR A PROJECT

(75) Inventors: Brian Berenbach, Edison, NJ (US); Herbert R. Foster, Jr., Princeton, NJ (US); William Sherman, Hillsborough, NJ (US)

(73) Assignee: Siemens Corporation, Iselin, NJ (US)

( * ) Notice: Subject to any disclaimer, the term of this patent is extended or adjusted under 35 U.S.C. 154(b) by 1161 days.

(21) Appl. No.: 11/207,240

(22) Filed: Aug. 19, 2005

(65) Prior Publication Data

US 2006/0059027 A1    Mar. 16, 2006

Related U.S. Application Data

(60) Provisional application No. 60/604,521, filed on Aug. 26, 2004.

(51) Int. Cl.
*G06F 9/44* (2006.01)
*G06F 9/45* (2006.01)

(52) U.S. Cl. ......................................... 717/105; 717/136
(58) Field of Classification Search .................... 717/105
See application file for complete search history.

(56) References Cited

U.S. PATENT DOCUMENTS

| | | | | |
|---|---|---|---|---|
| 5,892,947 A * | 4/1999 | DeLong et al. | ............... | 717/100 |
| 6,219,833 B1 * | 4/2001 | Solomon et al. | ............... | 717/149 |
| 6,910,204 B1 * | 6/2005 | Rossomando | ................ | 717/108 |
| 6,950,802 B1 * | 9/2005 | Barnes et al. | ...................... | 705/7 |
| 7,102,641 B2 * | 9/2006 | Hudson, Jr. | .................... | 345/440 |
| 7,191,429 B2 * | 3/2007 | Brassard et al. | ............. | 717/104 |
| 2004/0088677 A1 * | 5/2004 | Williams | ...................... | 717/104 |

OTHER PUBLICATIONS

Craig Larman, "Applying UML and Patterns: An Introduction to Object-Oriented Analysis and Design and the Unified Process, Second Edition"; Jul. 13, 2001, Prentice Hall, Chapter 25.*

* cited by examiner

*Primary Examiner* — James D Rutten
(74) *Attorney, Agent, or Firm* — Donald B. Paschburg; F. Chau & Associates, LLC

(57) ABSTRACT

A method for modeling requirements of a product includes defining an abstract use case for each feature of said product, hierarchically decomposing each abstract use case until concrete use cases are specified for each feature, depicting every actor who would use the product as communicating with a concrete use case through a boundary, and programmatically extracting requirements from the use case diagram. Programmatically extracting requirements further includes converting use case diagrams into directed acyclic graphs, where each use case corresponds to a node of a graph and each relationship between a pair of use cases is represented by a directed edge between the corresponding pair of nodes in the graph where a directed edge points from a parent node to a child node, converting the directed acyclic graph into a tree, and searching the tree to extract the requirements.

18 Claims, 11 Drawing Sheets

Sample Use Case Model

The Automated Extraction of Requirements from UML Models

 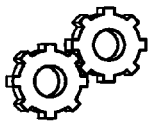 
FIG. 1(a)  FIG. 1(b)  FIG. 1(c)
| From/To | Use Case | RQT | NFRQT | Hazard |
|---|---|---|---|---|
| Use Case | communicates | includes | includes | may have |
| RQT | included | impacts | impacts | derived from |
| NFRQT | included | impacts | impacts | derived from |
| Hazard | may result from | derives | derives | associated with |
FIG. 2

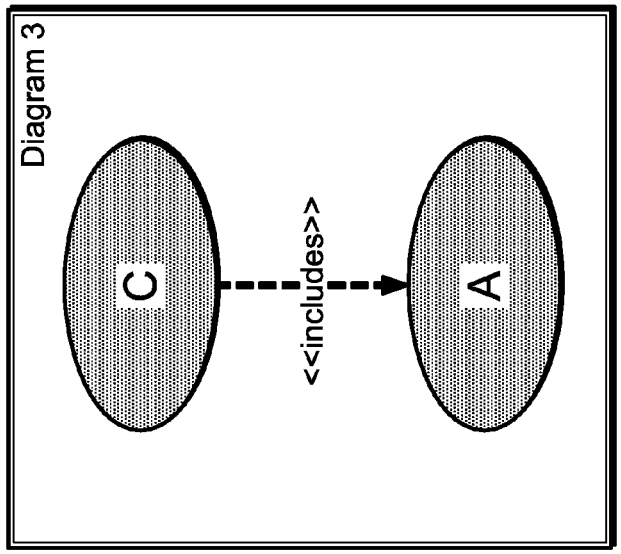
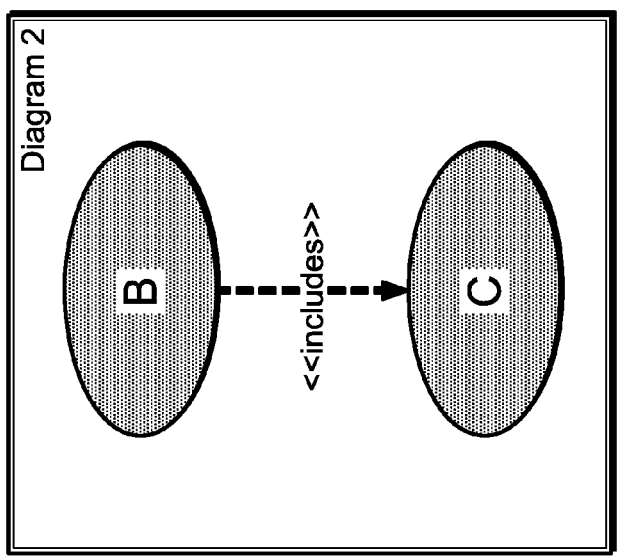
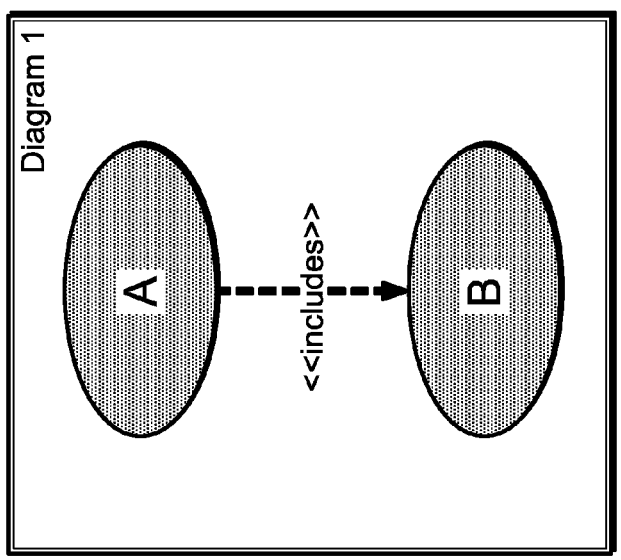
FIG. 8

The Automated Extraction of Requirements from UML Models

Conversion Precedence Table I

| | Relationship 1 | | |
|---|---|---|---|
| | Includes | Extends | Derived |
| Includes | Table II | Includes | Derived |
| Extend | Includes | Table II | Derived |
| Derived | Derived | Derived | Table II |

Relationship 2

The Automated Extraction of Requirements from UML Models

Conversion Precedence Table II

| | State | Action |
|---|---|---|
| 1 | Keep with highest level. | If a node has two predecessor relationships of the same type, keep the relationship where the predecessor node is at a higher level (fewest vertices to travel back to root). |
| 2 | Keep with same package. | If a node has two predecessor relationships of the same type, keep the relationship where the predecessor node is in the same package as the child node. |
| 3 | Keep with higher level package. | If a node has two predecessor relationships of the same type, keep the relationship where the predecessor node is in a higher level package. |
| 4 | Keep first encountered. | If a node has two predecessor relationships with all criteria the same (1-3), keep the first relationship encountered. |

The Automated Extraction of Requirements from UML Models

FIG. 11

The Automated Extraction of Requirements from UML Models

SYSTEM AND METHOD FOR SPECIFYING FUNCTIONAL AND NON-FUNCTIONAL REQUIREMENTS FOR A PROJECT

CROSS REFERENCE TO RELATED UNITED STATES APPLICATIONS

This application claims priority from "A Unified System for Defining Functional and Non-Functional Requirements", U.S. Provisional Application No. 60/604,521 of Brian Berenbach, filed Aug. 26, 2004, the contents of which are incorporated herein by reference.

TECHNICAL FIELD

This invention is directed to modeling requirements for software systems development, and to graphical models for visualizing the relationships between product features, hazards, and requirements.

DISCUSSION OF THE RELATED ART

The typical process by which requirements are defined on large projects has not changed for several years. Teams of analysts and subject matter experts define functional requirements. Architects and other experts define non-functional requirements. If the resultant set of requirements is large, traceability, readability and verification can be difficult. There are difficulties inherent in the above approach. Functional and non-functional requirements are defined by different individuals or teams. The separation of the requirements effort usually involves different subject matter experts, and often involves different tool sets. In addition, because different subject matter experts are used on different teams, they often do not review each other's work. This means that (1) functional requirements discovered during architectural sessions may not get communicated to the requirements team; and (2) non-functional requirements discovered during modeling or use case writing or reviews may not get communicated to the architectural team.

In order to have an effective risk mitigation process it is necessary to have full traceability. Current modeling tools typically involve the use of a requirements database, to which are added hazards and their mitigating requirements, and then manually creating traces back to the features that had the potential hazards. When the requirements are elicited using different teams, tools, and processes, tracing between requirements can be problematic. For example, suppose an architectural review exposes the requirement that a certain type of device will be needed in the future. How will this requirement be traced to functional requirements? One common solution is to put all the requirements into a single repository and then, post discovery, create traces between the requirements. This approach breaks down with large databases as it becomes increasingly difficult to identify all the necessary links.

Global analysis is a high-level design technique, performed during the early stages of software architecture design for determining design and project strategies. Global analysis considers factors that influence the design of the software product line, grouped into categories of organizational, technological, and product influences. Analysis of the influencing factors results in a set of design strategies that are used to guide a product line architecture design. These strategies are realized with functional and non functional requirements.

Hazard analysis also presents additional challenges to the requirements analyst. Hazards in this context refer to physical hazards to the end user of the software, not the risks associated with the project. An example would be the potential hazard to a person receiving an excessive dose of X-rays when getting a dental checkup. The embedded software that controls the X-ray machine has an identifiable hazard. The risk that this hazard may occur must then be quantified (high, medium, low), and risk mitigation strategies must be identified and implemented. The resultant mitigation strategy may result in the generation of more functional and non-functional requirements that are difficult to back trace to the hazard from which they derive.

Another issue associated with diverse, simultaneous efforts is that of synchronizing requirements with UML use case diagrams. A large business model can contain several hundred use cases. If the model is well formed, it will not be difficult to navigate. Nevertheless, post-analysis, connecting requirements back to their associated use-cases can be a time-consuming task.

To summarize, a project may have up to three disparate teams creating requirements using different processes and tools. As the project moves forward, the artifacts get larger, and the effort to trace requirements back to their origins becomes increasingly difficult.

SUMMARY OF THE INVENTION

Exemplary embodiments of the invention as described herein generally include methods and systems for programmatically extracting requirements from a UML model, and visualizing features, hazards and requirements and their relationships in a visual presentation on one or more diagrams. The model is essentially a directed graph, with requirements, hazards and use cases as vertices, and their relationships as edges. Moreover, the diagrams are just views into the model. Some advantages of a unified, model-driven approach to requirements elicitation include: (1) simplified requirement reuse; (2) stereotyping of requirements dependencies on a per-project basis, e.g., a stereotype could be "release 1" or "mandatory"; and (3) visualization of requirement inheritance. Non-functional and functional requirements are integrated in a single model, and readily visible on use case diagrams.

In accordance with an aspect of the invention, there is provided a method for modeling requirements of a product including defining an abstract use case for each feature of said product, hierarchically decomposing each abstract use case until concrete use cases are specified for each feature, depicting every actor who would use said product as communicating with a concrete use case through a boundary, and programmatically extracting requirements from said use case diagram.

In accordance with a further aspect of the invention, functional requirements, non-functional requirements, and hazards are each shown using different use-case stereotypes.

In accordance with a further aspect of the invention, decomposing an abstract use case further comprises systematically adding included, extending, and inheriting use cases until concrete use cases are specified for each abstract use case.

In accordance with a further aspect of the invention, said modeling is complete when each abstract use case has been decomposed into concrete use cases with no included, extending, or inheriting use cases.

In accordance with a further aspect of the invention, each concrete use case that represents an activity or process is explained in a sequence, activity, or state diagram.

In accordance with a further aspect of the invention, programmatically extracting requirements from said use case diagram further comprises the steps of converting said use case diagram into a directed acyclic graph, wherein each use case corresponds to a node of said graph, and each relationship between a pair of use cases is represented by a directed edge between the corresponding pair of nodes in said graph, wherein a directed edge points from a parent node to a child node, converting said directed acyclic graph into a tree, and searching said tree to extract said requirements.

In accordance with a further aspect of the invention, converting said use case diagram into a directed acyclic graph includes reversing the direction of relationship arrows that represent inheriting and extending relationships in said use case diagram, and removing all cycles from said use case diagram.

In accordance with a further aspect of the invention, converting said directed acyclic graph into a tree includes, when a child use case node of said graph has a plurality parent node relationships of the same type, removing relationships edges, and saving said removed relationship edges as traces.

In accordance with a further aspect of the invention, the method further comprises adding said traces to the requirements extracted from the search of said tree.

In accordance with a further aspect of the invention, said relationship edges are removed according to a set of precedence rules.

In accordance with a further aspect of the invention, said precedence rules for relationships of the same type include retaining the relationship to a highest level parent node, wherein said highest level parent node will be that parent node with the fewest nodes back to the root node of said tree, retaining the relationship to a parent node in the same package as the child node, retaining the relationship to a parent node in a higher level package, and retaining the first relationship encountered when all of the preceding criteria are the same.

In accordance with a further aspect of the invention, said precedence rules for relationships of different types include retaining a derives relationship over either an includes relationship or an extends relationship, and retaining an includes relationship over an extends relationship.

In accordance with another aspect of the invention, there is provided a program storage device readable by a computer, tangibly embodying a program of instructions executable by the computer to perform the method steps for modeling requirements of a product.

BRIEF DESCRIPTION OF THE DRAWINGS

FIGS. 1(a)-(c) depict exemplary symbols representing the new UML use cases, according to an embodiment of the invention.

FIG. 2 is a table illustrating the relationships between the new UML use cases, according to an embodiment of the invention.

FIG. 8 depicts an example of a cycle in a use case diagram, according to an embodiment of the invention.

FIG. 11 is a table of precedence relations among relationships of the same type, according to an embodiment of the invention.

DETAILED DESCRIPTION OF THE PREFERRED EMBODIMENTS

Figure 3:
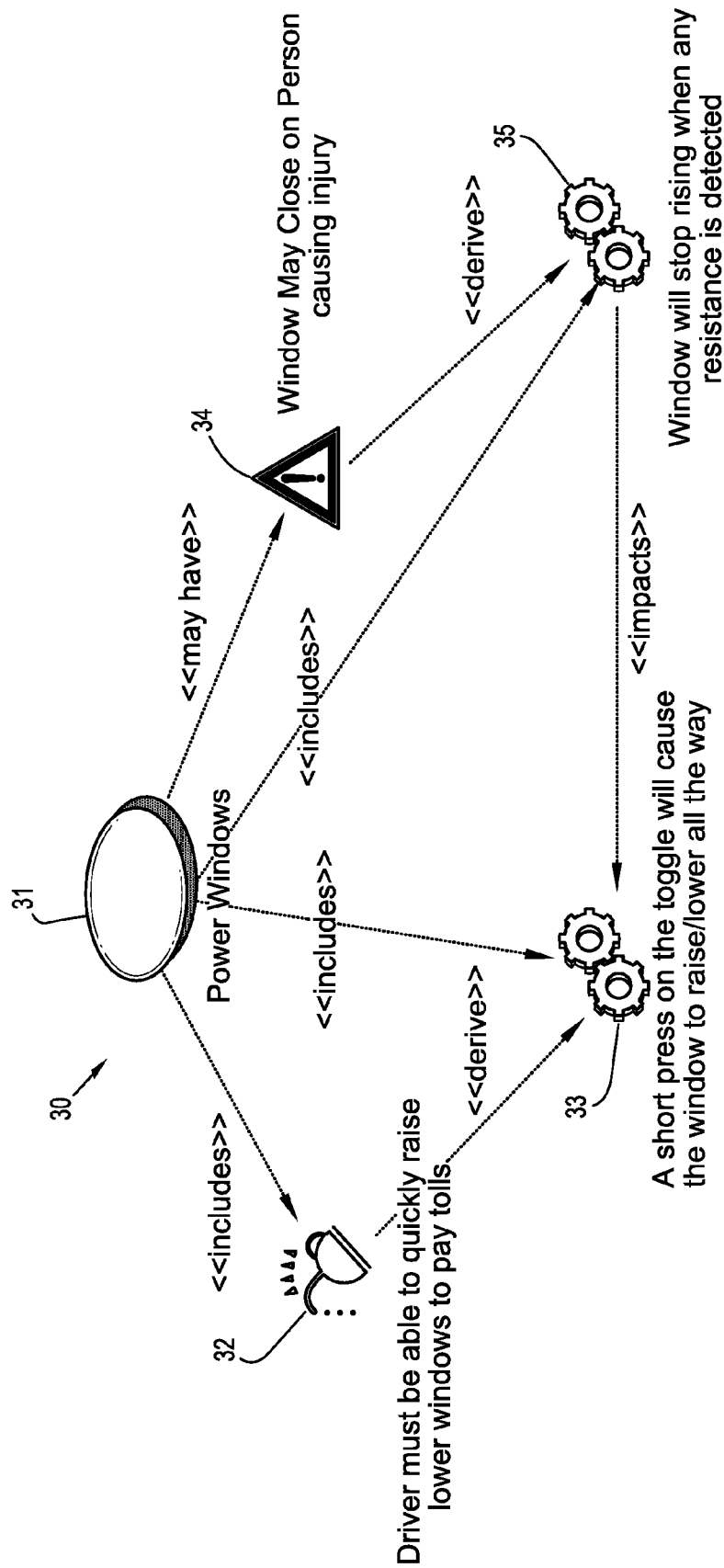
FIG. 3 depicts an exemplary use case diagram illustrating the new UML symbols and their relationships, according to an embodiment of the invention.

Exemplary embodiments of the invention as described herein generally include systems and methods for extending UML to support the integration of hazard and requirements analysis and the binding of resultant exposed requirements to their respective use cases, with enabling tool support.

The Unified Modeling Language (UML) is a standard language for specifying, visualizing, constructing and documenting the artifacts of software systems, as well as for business modeling and other non-software systems. The UML represents a collection of best engineering practices that have proven successful in the modeling of large and complex systems. UML forms an integral part of object oriented software development and three software development process. UML uses mostly graphical notations to express the design of software systems. Using UML helps project teams communicate, explore potential designs, and validate the architectural design of a software system.

There are currently 13 diagrams supported under UML, grouped into three categories: structure, behavior, and interaction. The structure diagrams include class, object, component, composite structure, package, and deployment diagrams. The behavior diagrams include use case, activity, and state chart diagrams. The interaction diagrams, which are derived from the behavior diagrams, include sequence, communication, timing, and interaction overview diagrams.

The use case diagram illustrates a system's functions from a user's point of view. Use case diagrams define the requirements of the system being modeled, and thus can be used to write test scripts for the modeled system. Use cases are intended to capture what a system is, not how the system will be designed or built. Use cases should be free of any design characteristics. Associated with a use case diagram is a use case document that documents the detailed functionality of each use case. A use case diagram typically includes use cases, actors, and associations.

A use case describes a sequence of actions that provide something of measurable value to an actor and is drawn as a horizontal ellipse. A use case visually represents a distinct functionality of the system. A first step in identifying use cases is listing discrete functions in a problem statement. Each discrete function can be classified as a potential use case. An actor is a person, organization, or external system that plays a role in one or more interactions with a system.

Actors are drawn as stick figures. For some use cases, there can be more than one actor involved. Associations between actors and use cases are indicated in use case diagrams by solid lines. An association exists whenever an actor is involved with an interaction described by a use case. Associations are modeled as lines connecting use cases and actors to one another, with an optional arrowhead on one end of the line. The arrowhead is often used to indicating the direction of the initial invocation of the relationship or to indicate the primary actor within the use case. Associations do not represent flows of information, but merely indicate an actor is somehow involved with a use case. Information can flow back and forth between the actor and the use case, however, use case diagrams do not model this sort of information. Actors are always involved with at least one use case and are always drawn on the outside edges of a use case diagram. If there are interactions between actors in the system, these interactions should not be represented in the same diagram, but rather in a separate use case diagram, where one actor is treated as the system, and the original system and the other actors are modeled as actors.

A use case diagram can optionally include a system boundary, which can take the form of a box surrounding the uses cases and separating the use cases from the actors. Anything inside the boundary box represents functionality that is within the scope of the model. A boundary will typically only be used on a top level use case diagram.

Use cases can share different types of relationships. A relationship between two use cases is essentially a dependency between the two use cases. Relationships support the reuse of existing use cases and can reduce the overall effort involved in defining use cases in a system. There are three types of relationships between use cases: extension, inclusion, and derivation. A relationship can be indicated in a use case diagram by a label known as a stereotype.

In use case inclusion, a use case includes the behavior or functionality of another use case. Use case inclusion is typically used to factor out common functionality that is shared between use cases. An include relationships is the equivalent of a procedure call. When including another use case, the parent use case explicitly states in its structure when the included case is invoked. When a parent use case includes several other use cses, then all of the child use cases must completed in the process of completing the parent use case. Use case inclusion is depicted with a directed arrow having a dotted shaft from the parent use case to the included use case. The stereotype "<<includes>>" (or "<<uses>>") identifies the relationship in the diagram.

In use case extension, a child use case adds to the existing functionality and characteristics of a parent use case. Use case extension encapsulates the functionality that is not considered part of the normal functionality of a use case. Unlike included use cases, extended use cases can be stand-alone use cases that plug in to a larger system at defined extension points in the parent use case. Use case extension is depicted with a directed arrow having a dotted shaft from the extended use case to the parent use case. The stereotype "<<extends>>" identifies the relationship in the diagram.

Use case derivation behaves like class inheritance in an object oriented language. A specialized child use case inherits the behavior of the parent use case. The specialized use case can replace or enhance the behavior of the parent use case, but adheres to the required behavior of the original use case. Use case derivation is depicted with a directed arrow having a solid shaft and a triangular arrowhead from the child use case to the parent use case. The stereotype "<<derives>>" identifies the relationship in the diagram.

Use cases can be further categorized as abstract or concrete. An abstract use case defines features and sub-features of the system being modeled, while concrete use will become the detailed requirements for which project tasks can be created and test cases can be generated. Concrete use cases identify the pieces of software that need to be implemented.

While technically part of UML, a use case document is closely related to a use case diagram. A use case document is a text document that specifies the detailed functionality of each use case in a diagram. A use case document typically include a brief description of the overall purpose of the use case diagram, preconditions that must be true for the use case to execute, the normal flow through the use case, variations to the basic flows that could result from use input or error conditions, and post conditions that must be true for the use case to complete. The document can also include any business rules for the basic and alternative flows as special requirements. These business rules can be used for writing test cases and for describing success and failure scenarios.

According to an embodiment of the invention, the use case diagram is chosen as the starting point for a unified modeling approach, and includes the following new UML extensions: a hazard symbol, a functional requirement symbol, and a non-functional requirement symbol. The hazard symbol, can be represented by the widely accepted hazard symbol, as depicted in FIG. 1(a). The functional requirement symbol can be represented by meshed gears, sometimes used to indicate process, as depicted in FIG. 1(b). The non-functional requirement symbol can be represented by an oilcan, as depicted in FIG. 1(c), as non-functional requirements represent the enablers of a process. The specific symbols used for representing these UML extensions are exemplary and non-limiting, and other symbols can be used and be within the scope of an embodiment of the invention.

In addition to defining symbols to represent these extensions, relationships between use cases, hazards, functional requirements and non-functional requirements can also be defined. These new relationships include, without limitation, <<may-have>> and <<impacts>>, as indicated in the table of FIG. 2. It is to be understood that other relationships can be defined between use cases, hazards, functional requirements and non-functional requirements and still be within the scope of an embodiment of the invention.

Referring now to FIG. 2, the includes relationship can hold between a use case and both a functional requirement and a non-functional requirement, while a may-have relationship can hold between a use case and a hazard. As the phraseology of the relationship name indicates, a may-have relationship indicates a possibility, i.e. the possible occurrence of the hazard represented by the child symbol, and that the hazard need not necessarily occur. The may-have relationship is depicted with a directed arrow having a dotted shaft from the parent use case to the possible use case. The impacts relationship can hold between pairs of functional requirements, pairs of non-functional requirements, and between functional and non-functional requirements. The impacts relationship expresses how one requirement has an effect on another requirement, by imposing further requirements on another use case. The impacts relationship is depicted with a directed arrow having a dotted shaft from the requirement use case imposing the additional requirement to the requirement use case being impacted by the additional requirement. Functional and non-functional requirements can also have a derives relationship with respect to a hazard. The derives relationship indicates that the child requirement use case that has been added in order to mitigate a hazard inherits its requirements from the need to mitigate the hazard.

An exemplary use case diagram illustrating the new symbols and their relationships is illustrated in FIG. 3. Use case diagram 30 models the functionality of a power window in an automobile. The top level functionality is represented by the PowerWindows use case 31. The PowerWindows 31 use case <<includes>> child use cases 32, 33, and 35. Non-functional requirement use case 32 indicates that a driver must be able to quickly raise and lower the window to pay tolls. Functional requirement use case 33 indicates that a short press on the toggle will cause the window to raise or lower all the way. Functional requirement use case 35 indicates that a window will stop rising when any resistance is detected. A derives relationship exists between non-functional requirement use case 32 and functional requirement use case 33 to indicate that the short press functionality was inherited from the need to quickly raise/lower the window. An impacts relationship exits between the functional requirements uses cases 35 and 33 to indicate that the use case 35 requirement that a window stops rising upon detection of resistance will impact the window rising/lowering behavior specified in use case 33. In addition, the PowerWindows 31 use case <<may-have>> a hazard use case 34, to indicate that the window could close on a person therefore causing injury. A derives relationship exists between hazard use case 34 and functional requirement use case 35 to indicate that requirement to stop rising upon detection of resistance was inherited from the need to mitigate the hazard indicted by the window closing on a person.

With these new relationships, the diagram of FIG. 3 can be interpreted as follows: "Rolling up power windows may have an associated hazard that the window can close on a person causing injury. The hazard is mitigated by adding (derives) the requirement to the use case that a window shall stop rising as soon as any resistance is detected. This requirement will impact another power windows requirement that a short press on the toggle will completely raise/lower the window. In addition, the driver window must lower quickly enough to enable the driver to pay a toll promptly."

Figure 4:
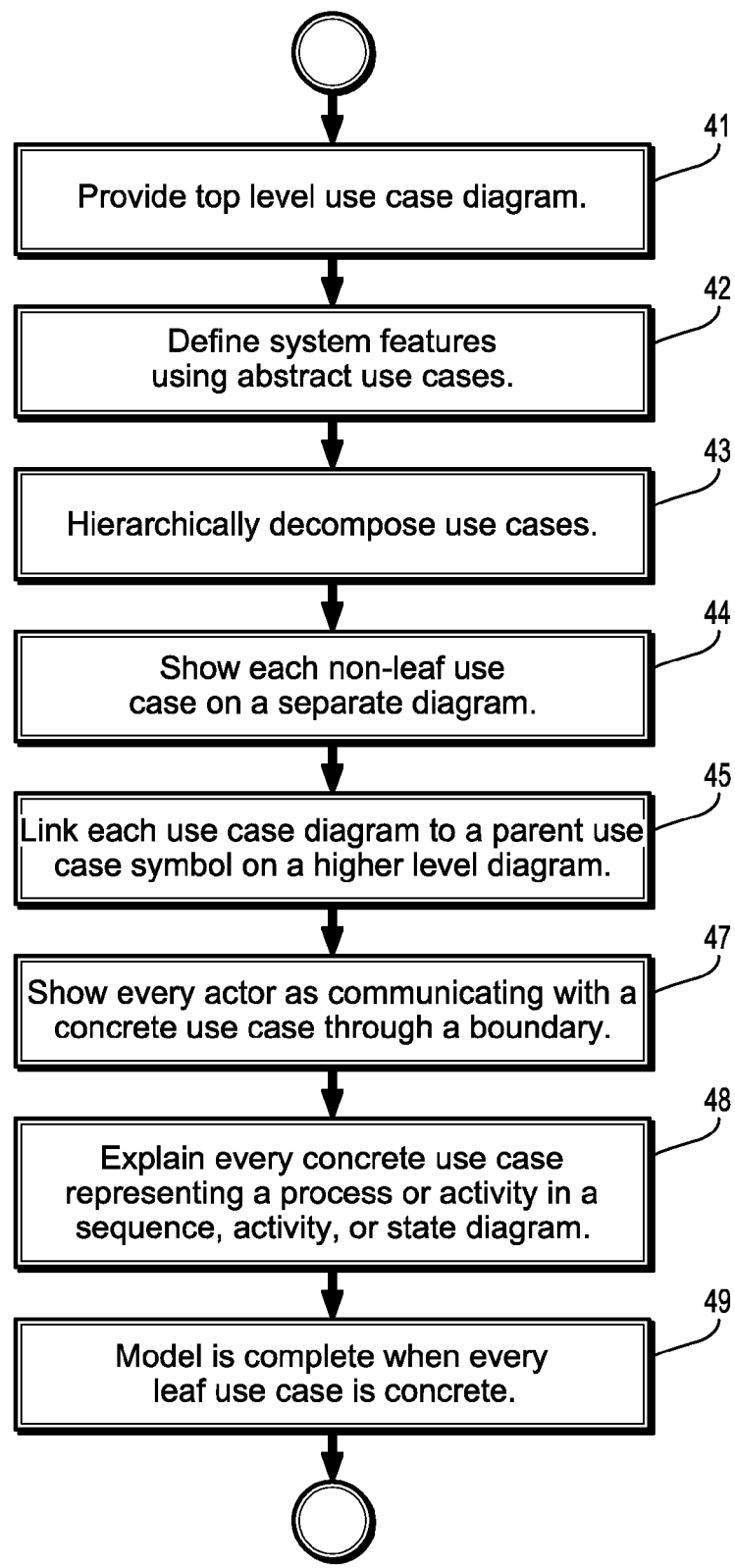
FIG. 4 is a flow chart of a formal process for defining the requirements of a product, according to an embodiment of the invention.

According to an embodiment of the invention, with these new use case extensions, a formal process for defining the requirements of a product can be specified that incorporates both new and previously defined heuristics and that can be tailored for particular modeling tools. This formal process is illustrated by the flow chart of FIG. 4, and includes the following steps. During the course of modeling, the following guidelines should be adhered to. First, show features as abstract use cases. Testable requirements that derive from the features should be shown as concrete use cases. Leaf testable functional requirements should be shown using a special stereotype, such as the gears depicted in FIG. 1(b). Leaf non-functional requirements should be shown using another special stereotype, such as the oil cans depicted in FIG. 1(c). Note that a terminal or leaf use case is one with no included, derived or extending use cases. Beginning at step 41, a single use case context diagram was the starting point for building the model. This diagram should show all actors who would be using the product under construction, and should serve as a single entry point for the model. At step 42, product features are defined using abstract use cases. At step 43, use cases are decomposed hierarchically, by systematically adding included, extending, and inheriting use cases until concrete uses cases are specified for each feature. At step 44, each non-leaf use case is shown with its included, extending and inheriting use cases on a separate diagram(s). Each use case diagram is linked at step 45 to the parent use case symbol on a higher level diagram. Abstract and concrete use cases should be clearly differentiated, with abstract use cases being treated as placeholders that, unlike concrete use cases, do not need further exposition in the form of sequence, collaboration, state or activity diagrams, and do not require test cases. At step 47, every actor shown on the use case context diagram is depicted communicating with a concrete use case through a boundary, to force a full inventory of all the interfaces that the product will need. At step 48, every concrete use case, representing a process or activity, is explained on a sequence, activity or state diagram. On a sequence diagram the use case is described as a message, such as a class method. On an activity diagram, the use case is shown as an activity, while on a state diagram, the use case is shown as a state transition. Use case descriptions should be filled in, artifacts (diagrams, use cases, etc.) should have a visible status, and the model should be kept clear, straightforward, and programmatically navigable. At step 49, it is determined whether the model is complete, and whether requirements and test cases can now be extracted. A model is complete when every leaf use case (a use case with no included, extending or inheriting use cases) was concrete. The leaf use cases are indicated by the stereotypes of functional and non-functional requirements, and hazards. The leaf use cases can serve as the high level requirements that are subject to a formal review. Furthermore, requirements can now be programmatically extracted from the use case diagrams.

According to an embodiment of the invention, programmatically extracting requirements from a use case diagram is performed by converting a use case diagram into a directed graph. A graph is a set of vertices V and a set E of edges between the vertices. In a directed graph, the edges have a direction associated with them that leads form one vertex of the edge to the other vertex. A use case diagram already resembles a directed graph in that arrows, which correspond to edges, connect related use cases, which correspond to vertices, except that for some relationships, the arrow directions would need to be reversed.

Figure 5:
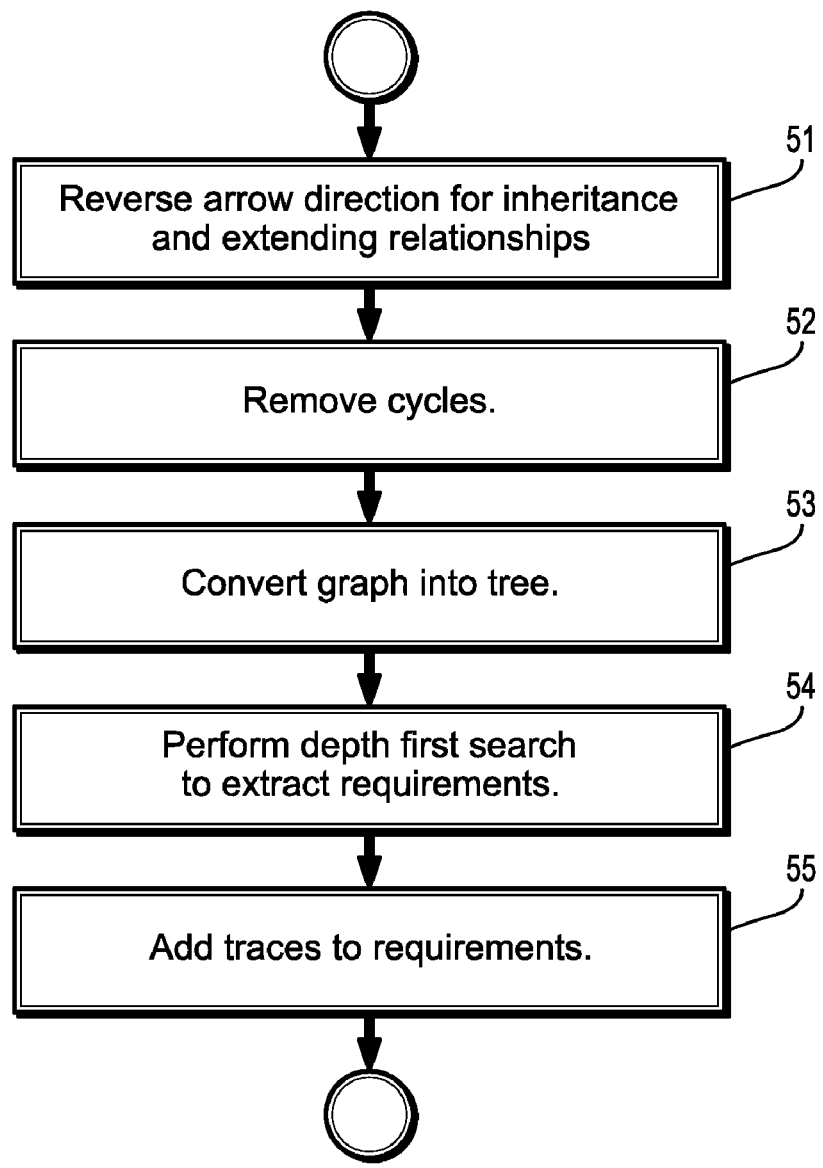
FIG. 5 is a flow chart of a process for programmatically extracting requirements from a use case diagram, according to an embodiment of the invention.
Figure 7:
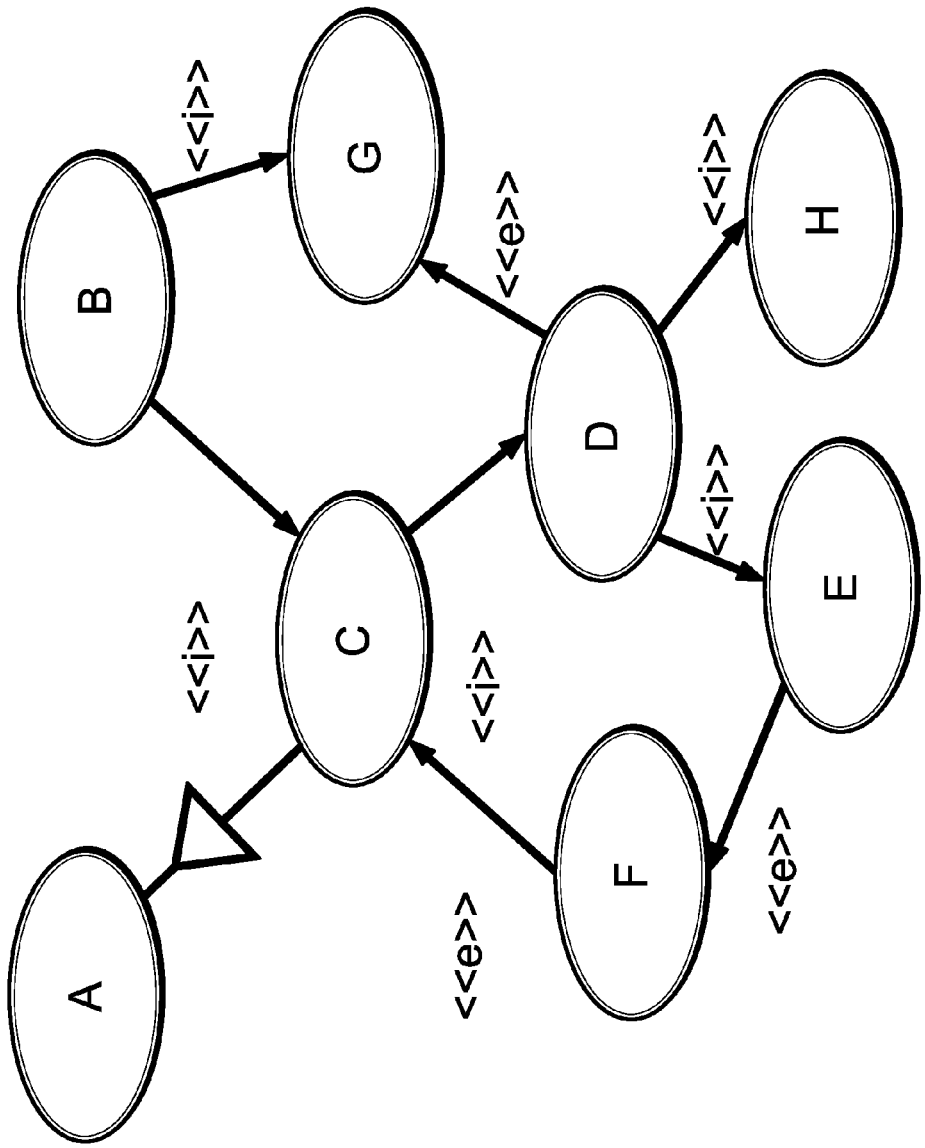
FIG. 7 depicts an exemplary use case diagram, according to an embodiment of the invention.
Figure 9:
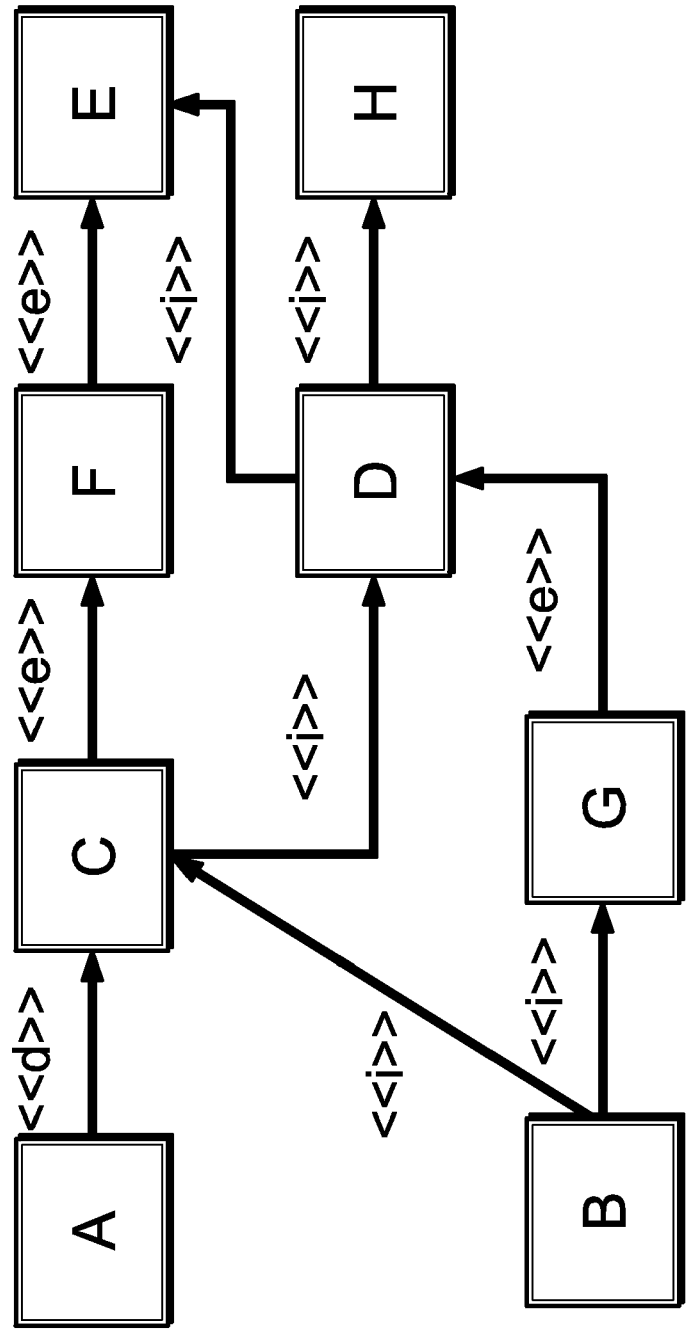
FIG. 9 depicts an exemplary DAG that results from the use case diagram of FIG. 7, according to an embodiment of the invention.

The process of converting a use case diagram into a directed graph is illustrated by the flow chart of FIG. 5, and includes the following steps. An exemplary use case diagram is depicted in FIG. 7. In this diagram, an includes relationship is indicated by a <<i>> stereotype, and an extends relationship is indicated by a <<e>> stereotype. First, at step 51, the direction of the arrows for the inheritance and extends relationships is reversed, so that they point from the parent use case node to the child use case node. Thus, referring to FIG. 7, the inheritance arrow from node C to node A would be reversed, as well as the extends arrows from node E to node F, node F to node C, and from node D to node G. At step 52, cycles are removed. A cycle is a set of directed edges that form a path that starts and ends at the same vertex. FIG. 8 depicts an example of a cycle in a use case diagram, in which node A <<includes>> node B, node B <<includes>> node C, and node C <<includes>> node A. A graph without cycles is known as a directed acyclic graph (DAG), and the graph that results from the application of steps 51 and 52 is a DAG. An exemplary DAG that results from the use case diagram of FIG. 7 is depicted in FIG. 9. Note that in this diagram a derives relationship is indicated by the <<d>> stereotype, while the <<i>> and <<e>> indicate includes and extends relationships, respectively.

Figure 10:
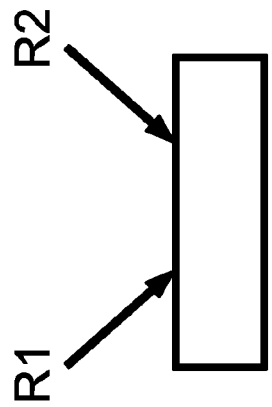
FIG. 10 is a table of precedence relations among relationships of different types, according to an embodiment of the invention.

Once a use case diagram has been converted into a DAG, it can be converted at step 53 into one or more trees, where each vertex has only one parent. Since the DAG formed from the use case diagram could include vertices with more than one parent vertex, rules and precedence relations can be used to determine which of these edges to remove. For example, referring to FIG. 9, node C is a child node of both nodes A and B, node D is a child of nodes G and C, and node E is a child node of nodes D and F. However, to prevent these relationships from being lost, the broken relationships are preserved as traces that can be added back into the final set of requirements, as explained below. One set of precedence relations is shown in Conversion Precedence Table I, depicted in FIG. 10. The precedence relations in Table I reflect the relative strengths of the various relationships, with an inheriting relationship being stronger than an including relationship, and an including relationship being stronger than an extending relationship. Thus, if a child node has an including relationship with one parent node, and an extending relationship with a second parent node, the extending relationship will be broken and saved as a trace. Similarly, if a child node has an including relationship with one parent node, and a derived relationship with a second parent node, the including relationship will be broken and saved as a trace. In addition, if a child node has an extending relationship with one parent node, and a derives relationship with a second parent node, the extending relationship will be broken and saved as a trace. A trace is a data structure that stores the type of relationship along with the identity of the parent and child nodes.

Figure 12:
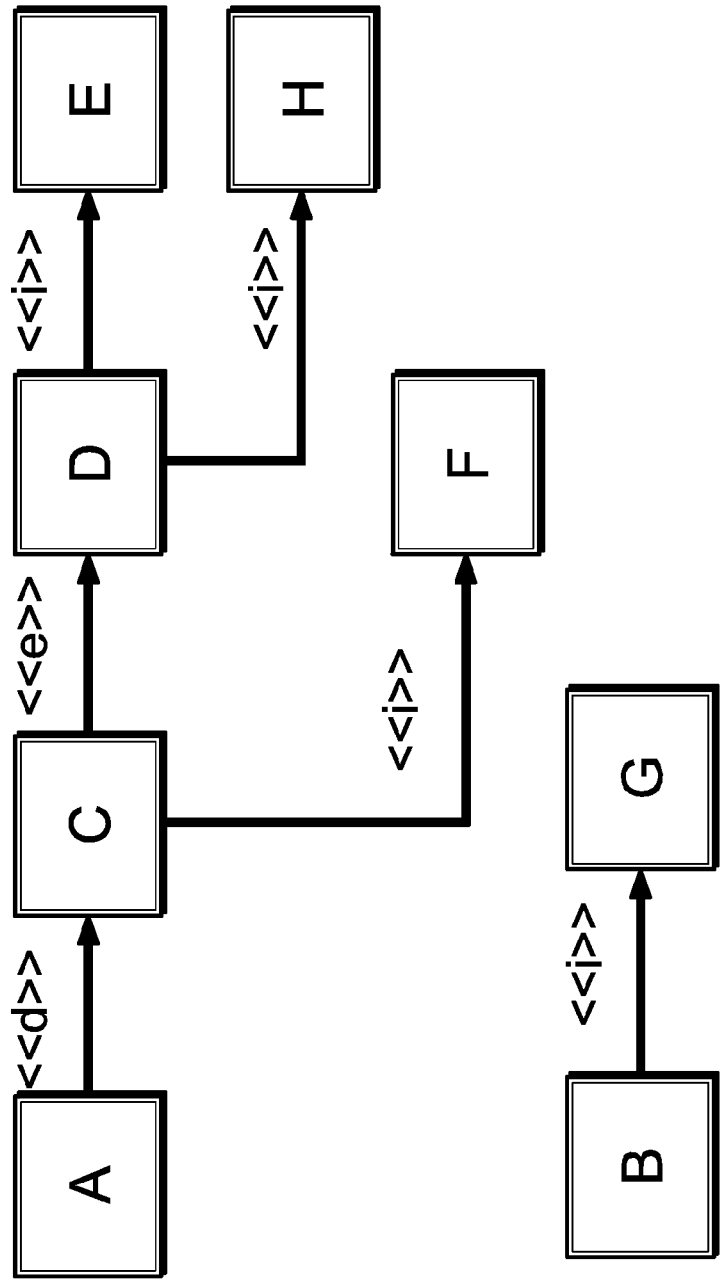
FIG. 12 shows an exemplary tree structure that resulted from the application of precedence rules to the graph of FIG. 9, according to an embodiment of the invention.

The precedence relations where a child node has multiple relationships of the same type with different parent nodes is more involved, however, and Table I refers to Table II, depicted in FIG. 11, for these precedence rules. Referring now to the Table II, a first rule states that if a node has two or more predecessor relationships of the same type, the relationship where the predecessor node is at a higher level should be retained. The higher level node will be that node with the fewest vertices back to the root node. Second, if the node has two or more predecessor relationships of the same type, the relationship where the predecessor node is in the same package as the child node should be retained. Here, a package is a collection of use cases, possible from different use case diagrams that are somehow related to each other, for example where a use case in one diagram has a relationship with a use case in another diagram. Third, the relationship where the predecessor node is in a higher level package should be retained. Finally, if the node has two or more predecessor relationships of the same type, but all of the preceding criteria are the same, keep the first relationship encountered. In each of these cases, the relationships that are broken are saved as traces. FIG. 12 shows an exemplary tree structure that resulted from the application of these precedence rules to the graph of FIG. 9. The relationship stereotypes in this diagram are the same as those depicted in FIGS. 9 and 7. Once the DAG has been converted into a tree, a depth first search is performed at step 54 to extract the requirements. The requirements can then be visually displayed in a hierarchical manner, where the hierarchy by the tree structure, with the root node of the tree being at the top of the requirements hierarchy. Finally, at step 55, the traces are added back into the requirements, this time as impacts relationships. The extracted requirements can serve as the basis for defining test suites for testing the finished product, and can be correlated with requirements stored in commercially available repositories. Coupling the requirements extracted form the product model with requirements in a repository enables one to determine whether every concrete use case is associated with one or more requirements, whether requirement in the repository is associated with at least one use case, and which use cases are impacted by hazards.

Pilot projects performed using the methodologies according to embodiments of the invention have illustrated the utility of these methodologies. In performing these pilot studies, each use case is assigned a status attribute, such as, draft, preliminary, accepted, etc. Reports periodically generated form the model showed the status of each use case, which makes it easy to keep track of incomplete or unreviewed use cases. Business rules can be defined and implemented for programmatically determining whether a use case should be accepted. For example, for a use case to be accepted, each included, extending or child use case should be accepted. The status of a use case diagram can be determined from the status of the use cases within the diagram, and the status of the requirements model can be determined from the status of the use case diagrams. The project status can be determined from the percentage of use cases and use case diagrams that have been accepted. The fact that requirements can be programmatically extracted also makes it easy to monitor the execution of a project.

It is to be understood that the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 6:
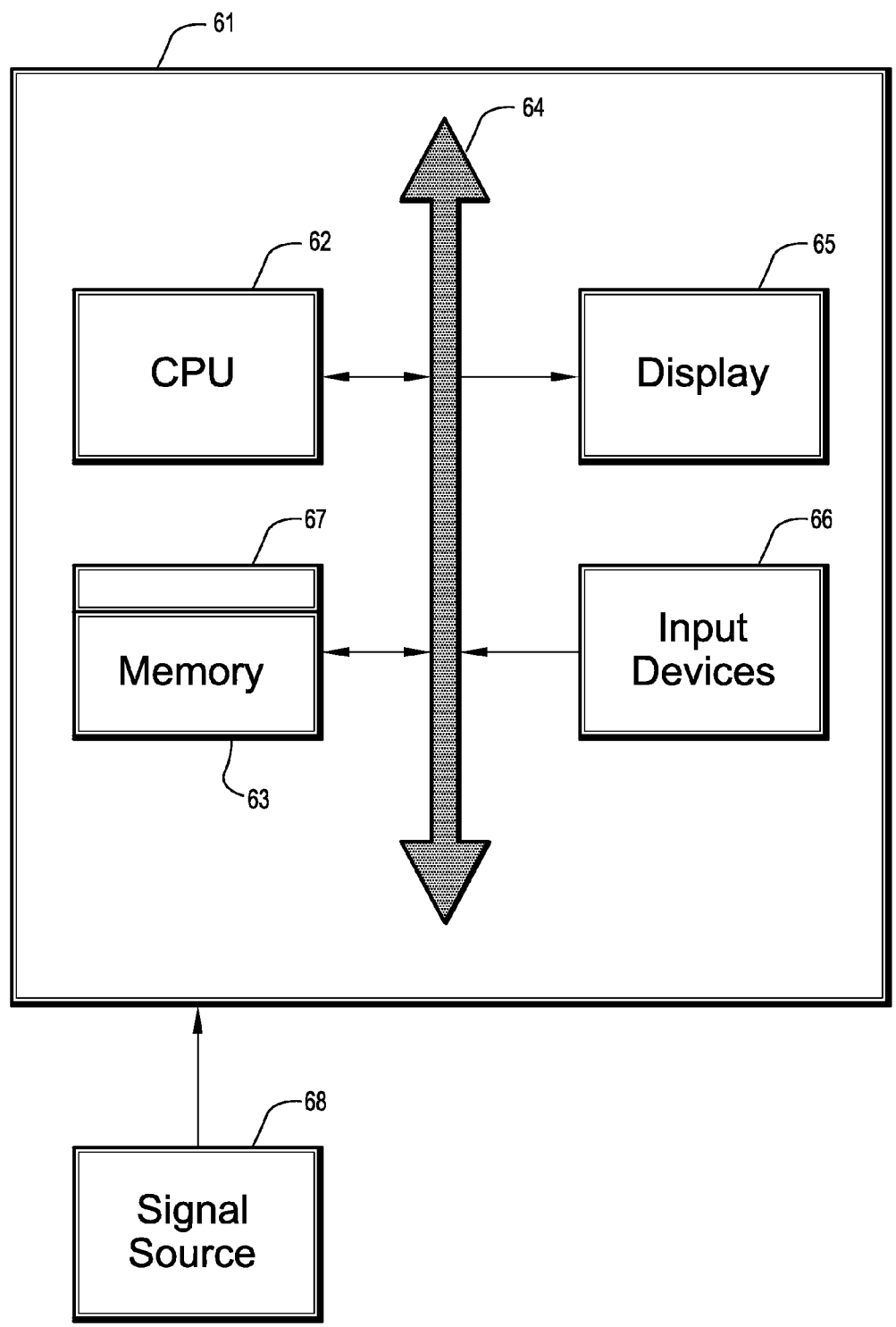
FIG. 6 is a block diagram of an exemplary computer system for implementing a joint space-intensity likelihood ratio test based segmentation method, according to an embodiment of the invention.

FIG. 6 is a block diagram of an exemplary computer system for implementing a toboggan-based object characterization scheme according to an embodiment of the invention. Referring now to FIG. 6, a computer system 61 for implementing the present invention can comprise, inter alia, a central processing unit (CPU) 62, a memory 63 and an input/output (I/O) interface 64. The computer system 61 is generally coupled through the I/O interface 64 to a display 65 and various input devices 66 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present invention can be implemented as a routine 67 that is stored in memory 63 and executed by the CPU 62 to process the signal from the signal source 68. As such, the computer system 61 is a general purpose computer system that becomes a specific purpose computer system when executing the routine 67 of the present invention.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A computer-implemented method for modeling requirements of a product comprising the steps of:
forming a use case diagram to define the requirements and features of said product, wherein said use case diagram programmatically incorporates functional requirements, non-functional requirements, hazards into a process model that defines an impact of each functional and non-functional requirement on said use cases and a relationship between each hazard and said process model;
converting said use case diagram into a directed acyclic graph, wherein each use case corresponds to a node of said graph, and each relationship between a pair of use cases is represented by a directed edge between the corresponding pair of nodes in said graph, wherein a directed edge points from a parent node to a child node,
converting said directed acyclic graph into a tree, and searching said tree to extract said requirements,
wherein converting said directed acyclic graph into a tree includes, when a child use case node of said graph has a plurality parent node relationships of the same type, removing relationships edges according to a set of precedence rules, and saving said removed relationship edges as traces, wherein said precedence rules for relationships of the same type include retaining the relationship to a highest level parent node, wherein said highest level parent node will be that parent node with the fewest nodes back to the root node of said tree, retaining the relationship to a parent node in the same package as the child node, retaining the relationship to a parent node in a higher level package, and retaining the first relationship encountered when all of the preceding criteria are the same,
wherein said steps of forming a use case diagram and converting said use case diagram into a directed acyclic graph are performed by a computer processor.

2. The method of claim 1, wherein said use case diagram comprises a plurality of abstract use cases for each feature of said product, and further comprising hierarchically decomposing each abstract use case until concrete use cases are specified for each feature, and depicting every actor who would use said product as communicating with a concrete use case through a boundary.

3. The method of claim 2, wherein decomposing an abstract use case further comprises systematically adding included, extending, and inheriting use cases until concrete use cases are specified for each abstract use case.

4. The method of claim 3, wherein said modeling is complete when each abstract use case has been decomposed into concrete use cases with no included, extending, or inheriting use cases.

5. The method of claim 3, wherein each concrete use case that represents an activity or process is explained in a sequence, activity, or state diagram.

6. The method of claim 1, wherein functional requirements, non-functional requirements, and hazards are each shown using different use-case stereotypes.

7. The method of claim 1, wherein converting said use case diagram into a directed acyclic graph includes reversing the direction of relationship arrows that represent inheriting and extending relationships in said use case diagram, and removing all cycles from said use case diagram.

8. The method of claim 1, further comprising adding said traces to the requirements extracted from the search of said tree.

9. The method of claim 1, wherein said precedence rules for relationships of different types include retaining a derives relationship over either an includes relationship or an extends relationship, and retaining an includes relationship over an extends relationship.

10. A program storage device readable by a computer, tangibly embodying a program of instructions executable by the computer to perform the method steps for modeling requirements of a product, said method comprising the steps of:
forming a use case diagram to define the requirements and features of said product, wherein said use case diagram programmatically incorporates functional requirements, non-functional requirements, hazards into a process model that defines an impact of each functional and non-functional requirement on said use cases and a relationship between each hazard and said process model;
converting said use case diagram into a directed acyclic graph, wherein each use case corresponds to a node of said graph, and each relationship between a pair of use cases is represented by a directed edge between the corresponding pair of nodes in said graph, wherein a directed edge points from a parent node to a child node,
converting said directed acyclic graph into a tree, and searching said tree to extract said requirements,
wherein converting said directed acyclic graph into a tree includes, when a child use case node of said graph has a plurality parent node relationships of the same type, removing relationships edges according to a set of precedence rules, and saving said removed relationship edges as traces, wherein said precedence rules for relationships of the same type include retaining the relationship to a highest level parent node, wherein said highest level parent node will be that parent node with the fewest nodes back to the root node of said tree, retaining the relationship to a parent node in the same package as the child node, retaining the relationship to a parent node in a higher level package, and retaining the first relationship encountered when all of the preceding criteria are the same,
wherein said steps of forming a use case diagram and converting said use case diagram into a directed acyclic graph are performed by a computer processor.

11. The computer readable program storage device of claim 10, wherein said use case diagram comprises a plurality of abstract use cases for each feature of said product, and further comprising hierarchically decomposing each abstract use case until concrete use cases are specified for each feature, and depicting every actor who would use said product as communicating with a concrete use case through a boundary.

12. The computer readable program storage device of claim 11, wherein decomposing an abstract use case further comprises systematically adding included, extending, and inheriting use cases until concrete use cases are specified for each abstract use case.

13. The computer readable program storage device of claim 12, wherein said modeling is complete when each abstract use case has been decomposed into concrete use cases with no included, extending, or inheriting use cases.

14. The computer readable program storage device of claim 12, wherein each concrete use case that represents an activity or process is explained in a sequence, activity, or state diagram.

15. The computer readable program storage device of claim 10, wherein functional requirements, non-functional requirements, and hazards are each shown using different use-case stereotypes.

16. The computer readable program storage device of claim 10, wherein converting said use case diagram into a directed acyclic graph includes reversing the direction of relationship arrows that represent inheriting and extending relationships in said use case diagram, and removing all cycles from said use case diagram.

17. The computer readable program storage device of claim 10, further comprising adding said traces to the requirements extracted from the search of said tree.

18. The computer readable program storage device of claim 10, wherein said precedence rules for relationships of different types include retaining a derives relationship over either an includes relationship or an extends relationship, and retaining an includes relationship over an extends relationship.

* * * * *